(12) United States Patent
Kim et al.

(10) Patent No.: US 8,604,624 B2
(45) Date of Patent: Dec. 10, 2013

(54) FLIP CHIP INTERCONNECTION SYSTEM HAVING SOLDER POSITION CONTROL MECHANISM

(75) Inventors: Oh Han Kim, Icheon (KR); Kyung Moon Kim, Youngin-si (KR)

(73) Assignee: Stats Chippac Ltd., Singapore (SG)

( * ) Notice: Subject to any disclaimer, the term of this patent is extended or adjusted under 35 U.S.C. 154(b) by 691 days.

(21) Appl. No.: 12/051,246

(22) Filed: Mar. 19, 2008

(65) Prior Publication Data
US 2009/0236756 A1 Sep. 24, 2009

(51) Int. Cl.
*H01L 23/48* (2006.01)

(52) U.S. Cl.
USPC ............ 257/778; 257/666; 257/748; 438/108

(58) Field of Classification Search
USPC ............................ 438/108; 257/748, 666, 778
See application file for complete search history.

(56) References Cited

U.S. PATENT DOCUMENTS

| | | | |
|---|---|---|---|
| 3,871,014 A | 3/1975 | King et al. | |
| 4,263,606 A * | 4/1981 | Yorikane | 257/737 |
| 5,160,409 A * | 11/1992 | Moore et al. | 216/13 |
| 6,194,777 B1 * | 2/2001 | Abbott et al. | 257/666 |
| 6,431,432 B1 | 8/2002 | McCormick et al. | |
| 6,469,386 B1 * | 10/2002 | Lee et al. | 257/748 |
| 6,566,762 B1 | 5/2003 | Baker et al. | |
| 6,577,012 B1 * | 6/2003 | Greenwood et al. | 257/766 |
| 6,772,510 B1 | 8/2004 | Corisis | |
| 6,828,688 B2 * | 12/2004 | Yagi | 257/787 |
| 6,861,740 B2 | 3/2005 | Hsu | |
| 7,033,864 B2 | 4/2006 | Libres et al. | |
| 7,141,994 B2 | 11/2006 | Akram | |
| 7,190,060 B1 * | 3/2007 | Chiang | 257/686 |
| 7,190,080 B1 | 3/2007 | Leu et al. | |
| 7,250,685 B2 | 7/2007 | Shim et al. | |
| 7,253,508 B2 | 8/2007 | Liu et al. | |
| 7,294,929 B2 | 11/2007 | Miyazaki | |
| 7,301,228 B2 | 11/2007 | Usui et al. | |
| 7,619,303 B2 * | 11/2009 | Bayan | 257/666 |
| 2003/0218249 A1 * | 11/2003 | Ho et al. | 257/737 |
| 2005/0110164 A1 | 5/2005 | Pendse | |
| 2005/0127486 A1 * | 6/2005 | Akram et al. | 257/678 |
| 2006/0099789 A1 * | 5/2006 | Mitchell et al. | 438/612 |
| 2008/0093717 A1 * | 4/2008 | Huang et al. | 257/673 |
| 2008/0237814 A1 * | 10/2008 | Bayan | 257/666 |

OTHER PUBLICATIONS

Martin Tarr, Organic board coatings, http://www.ami.ac.uk/courses/topics/0144_obc/index.html.
Terence Q. Collier, Back-end Process—Wafer Bumping, http://ap.pennnet.com/display_article/285171/36/ARTCL/none/INDUS/Back-end-Process-Wafer Bumping, Advanced Packaging Online Article.

* cited by examiner

*Primary Examiner* — Kimberly Rizkallah
*Assistant Examiner* — Caleb Henry
(74) *Attorney, Agent, or Firm* — Ishimaru & Associates LLP; I-Chang John Yang

(57) ABSTRACT

A flip chip interconnection system includes: providing a conductive lead coated with a protective coating; forming a groove through the protective coating to the conductive lead for controlling solder position on a portion of the conductive lead; and attaching a flip chip having a solderable conductive interconnect to the portion of the conductive lead.

5 Claims, 6 Drawing Sheets

FLIP CHIP INTERCONNECTION SYSTEM HAVING SOLDER POSITION CONTROL MECHANISM

TECHNICAL FIELD

The present invention relates to a method of connecting an integrated circuit chip to a substrate. More particularly, the invention relates to a flip chip interconnection system.

BACKGROUND ART

Portable electronics products such as cellular phone, PDA, DVC, DSC acquire multi-functions in an accelerating speed, and in such condition the miniaturization and the weight reduction is essential for these products to be accepted by the market, and thus LSI (large scale integration) having higher integration level are necessary to satisfy these needs.

On the other hand, more user-friendly and convenient products are also desired for these electronics products by the market, and thus LSI having multiple functions and higher performances are needed for utilizing these products. For this reason, number of inputs/outputs (I/O) increases as the level of the integration of LSI increases, while the requirement for miniaturizing the package itself becomes considerable.

In order to combine these two requirements into one product, developments of the semiconductor packaging, which is applicable for mounting the semiconductor devices at higher density of devices, is strongly demanded. To address these requirements, various developments in the packaging technology called "chip size packaging" or "chip scale packaging" (CSP) are actively conducted.

An integrated circuit die or a chip, is a small device formed on a silicon wafer, such as a semiconductor wafer. The integrated circuit die usually is made from a semiconductor material such as silicon or gallium arsenide. Such an integrated circuit die is typically cut from the wafer and attached to a substrate or base carrier for redistribution of interconnects.

Integrated circuit dies have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board).

Flip-chip bonding involves providing pre-formed solder bumps on the pads, flipping the chip or integrated circuit so that the pads face down and are aligned with and contact matching bond sites, and melting the solder bumps to wet the pads and the bond sites.

The attachment of a flip chip to a substrate such as printed circuit board involves aligning the solder bumps on the flip chip with a plurality of contact points (configured to be a mirror image of the solder ball arrangement on the flip chip) on a facing surface of the substrate. A plurality of solder bumps may also be formed on a facing surface of the substrate at the contact points.

To form the solder bumps reliably, wettable pads on the substrate are defined. The substrate pads are metallized to be wettable by the solder. Plated-copper metallization offers the lowest cost with great electrical conductivity. During the formation of the solder bumps, the solder wets only the wettable pads on the substrate. If wettable pads are not defined on the substrate, the solder would wet the substrate uncontrollably resulting in inconsistent formation or failure of the solder bumps and implicitly of the integrated circuit die.

To overcome this, usually a solder mask is formed on the facing surface of the substrate that has a plurality of openings corresponding to the solder bumps on the flip chip to limit the bump-bonding region on the substrate. The solder mask is used to protect (mask) certain areas of an integrated circuit board and confine the flow of solder during the soldering of connections to the circuit board and therefore prevent short-circuiting between solder bumps.

Increasing density and surface mount technology have increased the need for the solder mask to the point that, with the exception of the wettable pads, nearly all parts require the solder mask on the substrate.

One of the concerns with using the solder mask is the area on the substrate where the flip chip is mounted to the substrate. To design the openings in the solder mask that only leave the wettable pads exposed becomes difficult because of the increasingly tight tolerances.

Thus, a need still remains for a method to attach the flip chip to the substrate or printed circuit board to avoid solder contamination and bump collapse.

Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a flip chip interconnection system including providing a conductive lead coated with a protective coating; forming a groove through the protective coating to the conductive lead for controlling solder position on a portion of the conductive lead; and attaching a flip chip having a solderable conductive interconnect to the portion of the conductive lead.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
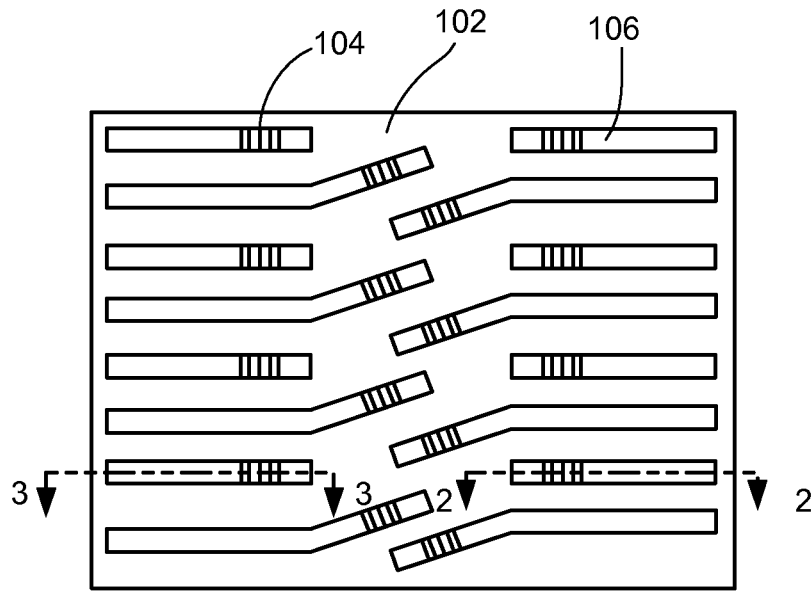
FIG. 1 is a top view of a portion of a flip chip interconnection system with a flip chip removed in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. Also, where multiple embodiments are disclosed and described, having some features in common, for clarity and ease of illustration, description, and comprehension thereof, similar and like features one to another will ordinarily be described with like reference numerals. The embodiments of the present invention have been numbered strictly as a matter of descriptive convenience and are not intended to be limiting.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is a direct contact among elements.

The term "processing" as used herein includes deposition of material or photoresist, patterning, exposure, development, etching, cleaning, and/or removal of the material or photoresist as desired in forming a described structure.

The term "system" as used herein means a method or device as will be evident from context.

The term "planar" as used herein means a flat surface having a two dimensional characteristic.

The term "pitch" as used herein means the distance between two adjacent conductive traces (or leads).

Referring now to FIG. 1, therein is shown a top view of a substrate 102. The substrate 102 has conductive leads or traces 104 coated with a protective coating 106.

The substrate 102 is an electrical insulator material to avoid shorting the conductive traces 104 and has certain physical and electrical qualities, such as stiffness, good dielectric properties and good surface resistivity. It is also resistant to solder and is solder-phobic. The conductive traces 104 are bonded to the substrate 102.

Figure 2:
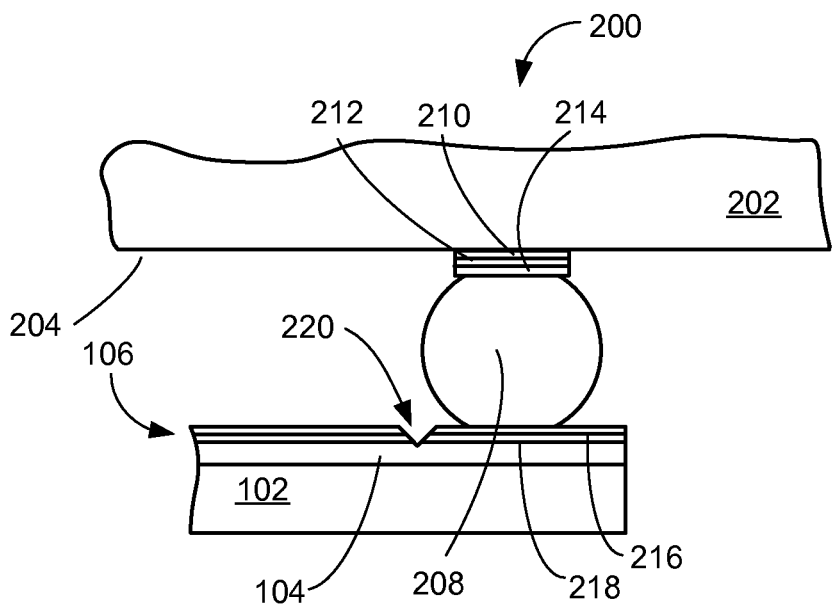
FIG. 2 is a close up of a cross-sectional view of a flip chip interconnection system along line 2-2 of FIG. 1 in a first embodiment of the present invention.

Referring now to FIG. 2, therein is shown a close up of a cross-sectional view of a flip chip interconnection system 200 along line 2-2 of FIG. 1 in a first embodiment of the present invention.

The flip chip interconnection system 200 includes a flip chip 202 having an active side 204, a conductive bump 208, such as a solderable conductive interconnect, the substrate 102 with the conductive trace 104, and the protective coating 106.

The flip chip 202 may be electrically and mechanically coupled to the substrate 102 using a flip chip interconnect, such as the conductive bump 208. The conductive bump 208 can be of solder materials such as lead, tin, and antimony.

To attach the conductive bump 208 to the flip chip 202, an under bump metallization is applied on the flip chip 202. The under bump metallization consists of an adhesion layer 210, such as titanium tungsten, for good adhesion to the flip chip 202, a barrier layer 212, such as a gold, to limit the diffusion of solder into the underlying material, and a solder wettable layer 214, such as a nickel, which offers an easily wettable surface to molten solder during assembly.

To attach the conductive bump 208 to the conductive trace 104, a reflow process is generally used to melt the conductive bump 208 and flow it on to the conductive trace 104.

However, it has been found that when using the conductive trace 104 made of an oxidizing material such as copper, the copper will be subject to oxidation and will become solder-phobic or difficult to bond with the solder of the conductive bump 208.

The protective coating 106 can include a first layer including nickel 218 and a second layer including gold 216. It has been discovered that the protective coating 106 can be used to prevent oxidation of the conductive trace 104 when the protective coating 106 is a non-oxidizing finish like gold 216 on nickel 218 on the conductive trace 104.

However, it has also been found that the non-oxidizing finish 106 is very easily wettable or solder-philic and the melted solder tends to spread over the length of the protective coating 106 on the conductive trace 104.

It has been discovered that by forming a groove 220 perpendicular to the length of the conductive trace 104 and through the protective coating 106 down to the conductive trace 104 can help restrict solder flow. The groove 220 formed through only the protective coating 106 exposes the conductive trace 104 at a bottom of the groove 220. The protective coating 106 is removed at the bottom of the groove 220 and the conductive trace 104 is subject to oxidation and becomes solder-philic at the groove 220. This means that the conductive bump 208 will not spread past the groove 220 and will be held in position on the conductive trace 104 until the conductive bump 208 cools.

Figure 3:
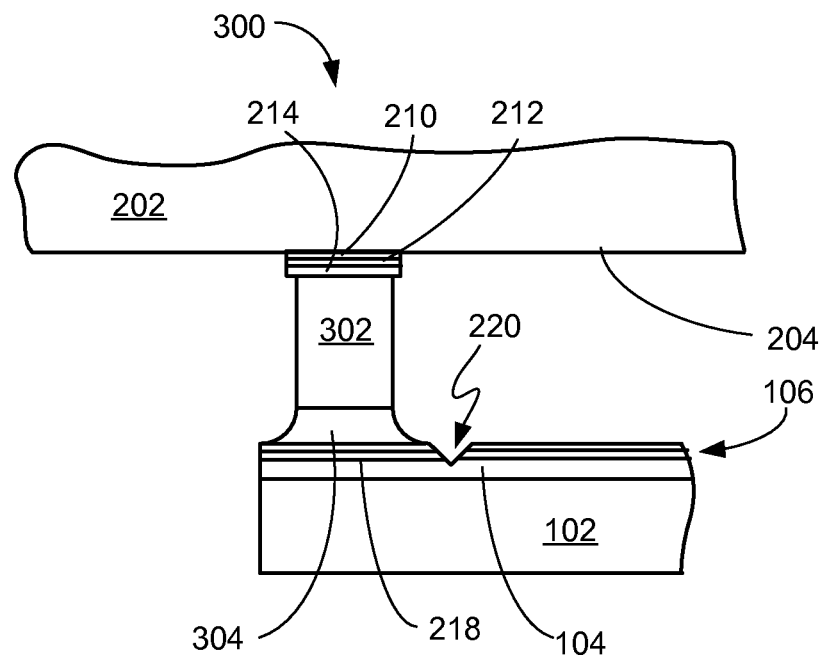
FIG. 3 is a close up of a cross-sectional view of a flip chip interconnection system along line 3-3 of FIG. 1 in a second embodiment of the present invention.

Referring now to FIG. 3, therein is shown a close up of a cross-sectional view of a flip chip interconnection system 300 along line 2-2 of FIG. 1 in a second embodiment of the present invention.

The flip chip interconnection system 300 includes the flip chip 202 having the active side 204, conductive pillars 302, and the substrate 102 with the conductive trace 104 and the protective coating 106.

The flip chip 202 may be electrically and mechanically coupled to the substrate 102 using a flip chip interconnect, such as a conductive pillar 302. The conductive pillar 302 can be of a material, such as copper. However, the conductive pillar 302, when made of copper, can have intermetallic issues and have a tendency to oxidize in the presence of some alloys.

It has been found that the conductive pillar 302 should have a solder tip 304 of lead, tin, or antimony to eliminate the impact of oxidation and intermetallics that may lead to reliability issues.

The conductive pillar 302 is often used instead of the conductive bump 208 of FIG. 2 to electrically and mechanically couple the flip chip 202 to the substrate 102.

Initially, the conductive pillar 302 is used to increase the standoff height between the flip chip 202 and the substrate 102. Keeping the flip chip 202 further away from the substrate 102 makes it less sensitive to the strains caused by coefficient of thermal expansion differences.

The conductive pillars 302 offer advantages over the conductive bumps 208, such as higher interconnect densities, higher reliability, improved electrical and thermal performance, and reduction or elimination of lead.

Due to the increased use of lead-free solder in ball-grid-array (BGA) packages, the conductive pillars 302 can now replace the conductive bumps 208.

While the conductive bumps 208 collapse during solder reflow, the conductive pillars 302 retain their three dimensional shape. This allows for fabrication of finer bump pitches (less than 70 μm), smaller passivation openings, and finer redistribution wiring for higher interconnect densities.

To attach the conductive pillar 302 to the flip chip 202, the under bump metallization is applied on the flip chip 202. The under bump metallization consists of the adhesion layer 210, such as titanium tungsten, for good adhesion to the flip chip 202, the barrier layer 212, such as a gold, to limit the diffusion of solder into the underlying material, and the solder wettable layer 214, such as a nickel, which offers an easily wettable surface to molten solder during assembly.

To attach the conductive pillar 302 to the conductive trace 104, a reflow process is used to melt the solder tip 304 and flow it on to the conductive trace 104.

However, it has been found that, when using the conductive trace 104 made of an oxidizing material such as copper, the copper will be subject to oxidation and will become solder-phobic or difficult to bond with the solder tip 304.

It has been discovered that the protective coating 106 can be used to prevent oxidation of the conductive trace 104 when the protective coating 106 is a non-oxidizing finish like gold 216 on nickel 218 on the conductive trace 104.

However, it has also been found that the non-oxidizing finish 106 is solder-philic and the solder tip 304 in its molten state tends to spread over the length of the protective coating 106 on the conductive trace 104.

It has been discovered that by forming the groove 220 perpendicular to the length of the conductive trace 104 and through the protective coating 106 down to the conductive trace 104 can help restrict solder flow. The protective coating 106 is removed at the bottom of the groove 220 and the conductive trace 104 is subject to oxidation and becomes solder-philic at the groove 220. This means that the solder tip 304 will not spread past the groove 220 and the conductive pillar 302 will be held in position on the conductive trace 104 until the solder tip 304 cools.

Figure 4:
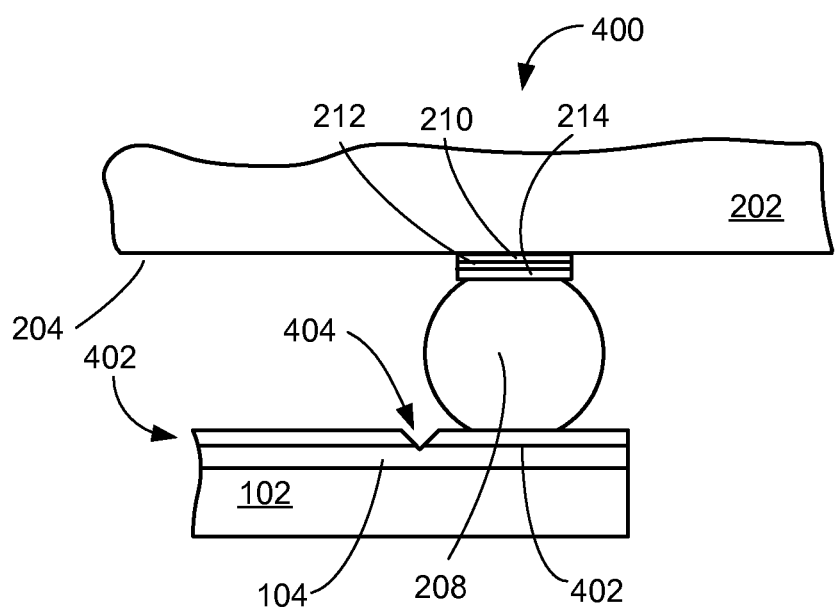
FIG. 4 is a close up of a cross-sectional view of a flip chip interconnection system along line 2-2 of FIG. 1 in a third embodiment of the present invention.

Referring now to FIG. 4, therein is shown a close up of a cross-sectional view of a flip chip interconnection system 400 similar to FIG. 2 in a third embodiment of the present invention.

The flip chip interconnection system 400 includes the flip chip 202 having the active side 204, the conductive bump 208, the substrate 102 with the conductive trace 104 and a protective coating 402.

The flip chip 202 may be electrically and mechanically coupled to the substrate 102 using a flip chip interconnect, such as the conductive bump 208. The conductive bump 208 can be of solder materials such as lead, tin, and antimony.

To attach the conductive bump 208 to the flip chip 202, an under bump metallization is applied on the flip chip 202. The under bump metallization consists of the adhesion layer 210, such as titanium tungsten, for good adhesion to the flip chip 202, the barrier layer 212, such as a gold, to limit the diffusion of solder into the underlying material, and the solder wettable layer 214, such as a nickel, which offers an easily wettable surface to molten solder during assembly.

To attach the conductive bump 208 to the conductive trace 104, a reflow process is generally used to melt the conductive bump 208 and flow it on to the conductive trace 104.

However, it has been found that when using the conductive trace 104 made of an oxidizing material such as copper, the copper will be subject to oxidation and will become solder-phobic or resistant to bonding with the solder of the conductive bump 208.

The gold 216 and the nickel 218 of FIG. 2 are an expensive protective coating 106 so a less expensive coating is desirable. It has been discovered that the conductive traces 104 may be coated with the protective coating 402 made of an organic solderability preservative (OSP) layer to prevent oxidation of the exposed copper. OSP compounds include azole-type compounds with various derivatives of benzotriazole, imidazole, benzimidazole, etc.

The protective coating 402 made of an OSP layer has the advantage over other surface finishing methods that allows multiple passes through reflow ovens without degradation of the solderability and is a cost-effective surface finish solution.

However, it has also been found that the non-oxidizing finish 106 of the organic solderability preservative is solder-philic and the melted solder tends to spread over the length of the protective coating 402 on the conductive trace 104.

It has been discovered that by forming a groove 404 perpendicular to the length of the conductive trace 104 and through the protective coating 402 down to the conductive trace 104 can help restrict solder flow. The protective coating 402 is removed at the bottom of the groove 404 and the conductive trace 104 is subject to oxidation and becomes solder-philic at the groove 404. This means that the conductive bump 208 will not spread past the groove 404 and will be held in position on the conductive trace 104 until the conductive bump 208 cools.

Figure 5:
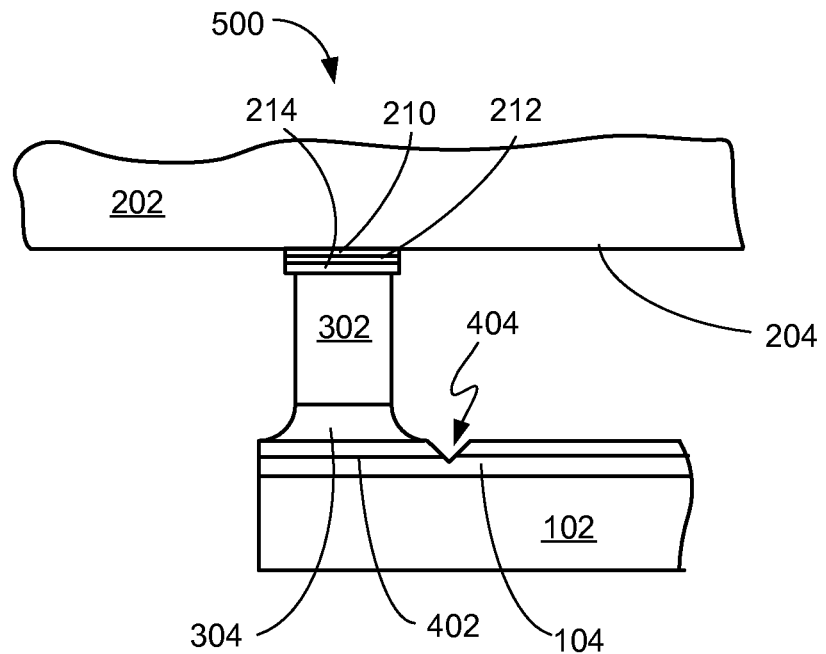
FIG. 5 is a close up of a cross-sectional view of a flip chip interconnection system along line 3-3 of FIG. 1 in a fourth embodiment of the present invention.

Referring now to FIG. 5, therein is shown a close up of a cross-sectional view of a flip chip interconnection system 500 similar to FIG. 3 in a fourth embodiment of the present invention.

The flip chip interconnection system 300 includes the flip chip 202 having the active side 204, the conductive pillar 302, and the substrate 102 with the conductive trace 104 and the protective coating 106.

The flip chip 202 may be electrically and mechanically coupled to the substrate 102 using a flip chip interconnect, such as the conductive pillar 302. The conductive pillar 302 can be of a material, such as copper. However, the conductive pillars 302, when made of copper, can have intermetallic issues and have a tendency to oxidize in the presence of some alloys.

It has been found that the conductive pillar 302 should have the solder tip 304 of lead, tin, or antimony to eliminate the impact of oxidation and intermetallics that may lead to reliability issues.

The conductive pillars 302 are often used instead of the conductive bumps 208 of FIG. 2 to electrically and mechanically couple the flip chip 202 to the substrate 102.

To attach the conductive pillar 302 to the flip chip 202, an under bump metallization is applied on the flip chip 202. The under bump metallization consists of the adhesion layer 210, such as titanium tungsten, for good adhesion to the flip chip 202, the barrier layer 212, such as a gold, to limit the diffusion of solder into the underlying material, and the solder wettable layer 214, such as a nickel, which offers an easily wettable surface to molten solder during assembly.

To attach the conductive pillar 302 to the conductive trace 104, a reflow process is used to melt the solder tip 304 and flow it on to the conductive trace 104.

However, it has been found that, when using the conductive trace 104 made of an oxidizing material such as copper, the copper will be subject to oxidation and will become solder-phobic or resistant to bonding with the solder tip 304.

The gold 216 and the nickel 218 of FIG. 2 are an expensive protective coating 106 so a less expensive coating is desirable. It has been discovered that the conductive traces 104 may be coated with the protective coating 402 made of an organic solderability preservative (OSP) layer to prevent oxidation of the exposed copper.

However, it has also been found that the non-oxidizing finish 106 of the organic solderability preservative is solder-philic and the melted solder tends to spread over the length of the protective coating 402 on the conductive trace 104.

It has been discovered that by forming the groove 404 perpendicular to the length of the conductive trace 104 and through the protective coating 402 down to the conductive trace 104 can help restrict solder flow. The protective coating 402 is removed at the bottom of the groove 404 and the conductive trace 104 is subject to oxidation and becomes solder-philic at the groove 404. This means that the conductive bump 208 will not spread past the groove 404 and will be held in position on the conductive trace 104 until the conductive bump 208 cools.

Figure 6:
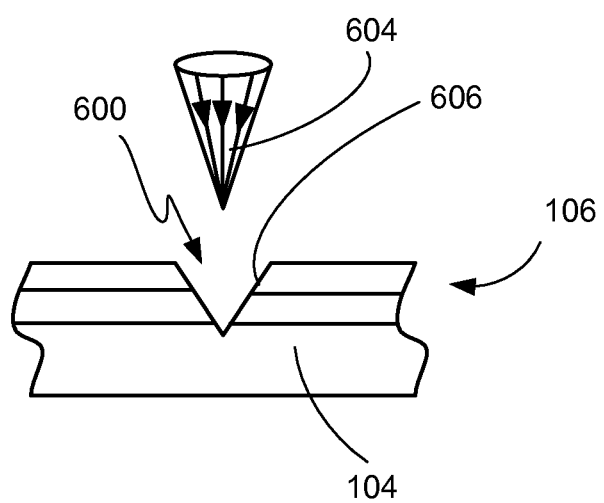
FIG. 6 is a closeup view of a cut being made in accordance with various embodiments of the present invention.

Referring now to FIG. 6, therein is shown a close-up view of a groove 600 being formed in accordance with various embodiments of the present invention.

Among the methods that may be used to cut the groove 600 are mentioned the mechanical scratching, etching, ion beam method, laser cutting, etc.

In mechanical scratching process, since the conductive material that the conductive trace 104 is made of is a soft metal, such as copper, mechanical removal from the inside of the conductive trace 104 can be done using a stylus. This would be similar to surface profiling where stylus of radius 50 nm to 25 microns is used.

Etching can be used to remove a groove-shaped feature from the conductive trace 104. A masking photoresist would be applied on the conductive trace 104 by photolithography, leaving a line for the groove 600 to be etched, after which the masking photoresist would be removed.

In the ion beam method, a focused ion beam and ion accelerators can be used to produce micron-sized grooves in different materials.

While the groove 600 can be formed in any way of any configuration that extends through the protective coating 106 down to the conductive trace 104, it has been discovered that a green laser 604 is ideal for this application.

The green laser 604 offers the possibility of cutting the groove 600 without prior surface preparation or surface cleaning. The green laser 604 is characterized by the cutting of arbitrary groove shapes, such as V-shape, in the conductive trace 104 leaving surface walls 606 of the groove 600 smooth and planar.

The green laser 604 has a high energy pulse and is able to cut the groove 600 at high speed and thus limits the heat damage to the surrounding, such as to the protective coating 106 or the conductive trace 104.

It has been discovered that using a material which has good ductility, such as copper, to make the conductive traces 104 minimizes the likelihood of cracking of the conductive traces 104 during laser cutting of the groove 600 with the green laser 604.

Figure 7:
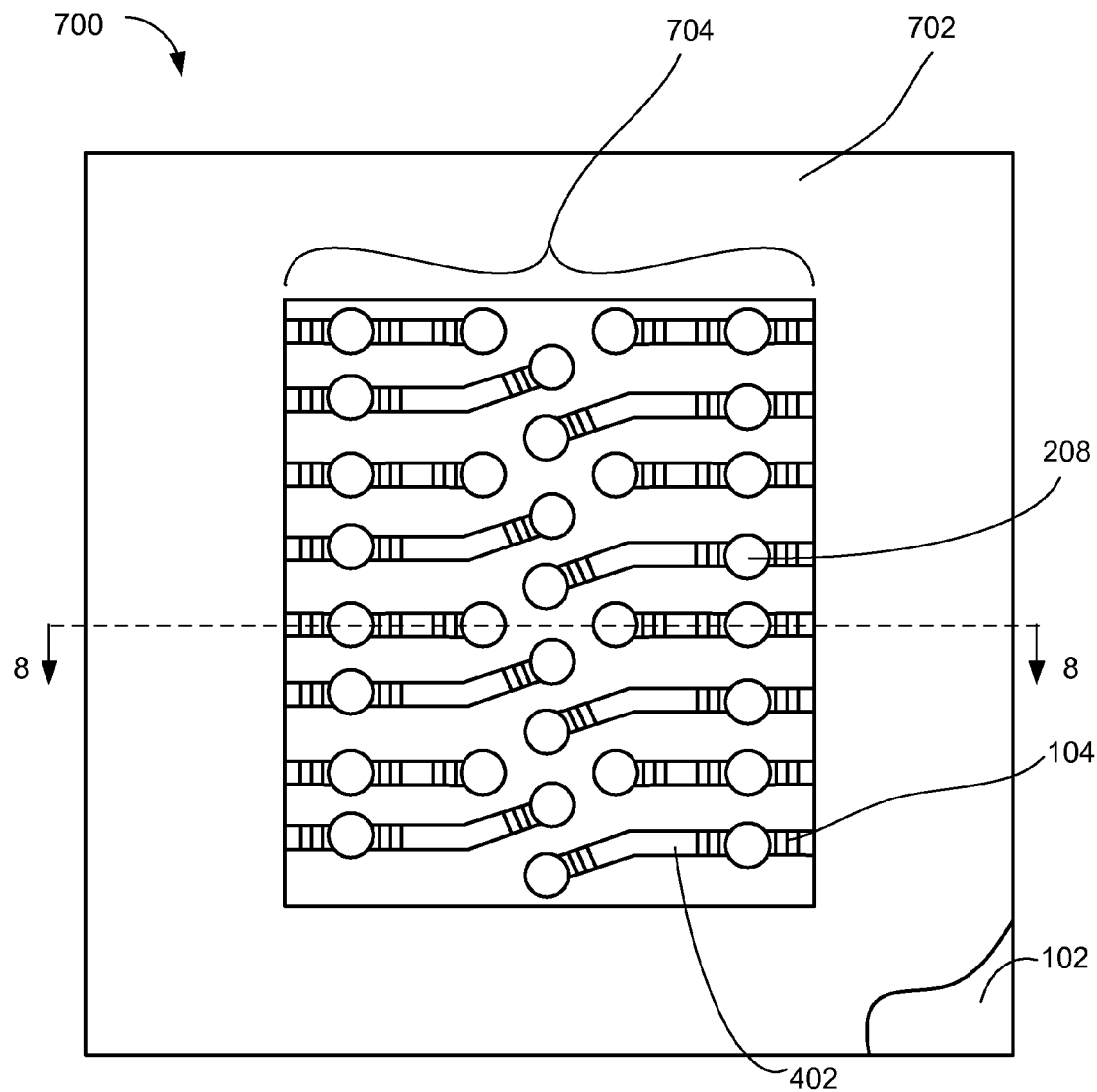
FIG. 7 is a top view of a flip chip interconnection system in a fifth embodiment of the present invention.

Referring now to FIG. 7, therein is shown a top view of a flip chip interconnection system 700 in a fifth embodiment of the present invention. The top view of the flip chip interconnection system 700 has the flip chip 202 removed.

The flip chip interconnection system 700 includes the substrate 102 with the conductive traces 104 coated with the protective coating 106. The conductive bumps 208, are on the protective coating 106 of the conductive traces 104.

While various embodiments of the present invention can be used without a solder mask, it has been found that there is a risk of the solder forming micro solder balls during reflow that may bridge the conductive traces 104 and cause short circuits.

At the same time, it is desirable to avoid having to form a solder mask that must precisely clear the solder locations over the conductive traces.

Since the conductive bumps 208 are under the flip chip 202 of FIG. 2, it has been discovered that forming a solder mask 702 that only exposes an area 704 under the flip chip 202 will mask most of the conductive traces 104 and reduce the risk of micro solder balls bridging a good portion of the conductive traces 104.

The solder mask 702 may comprise an acrylic or a polyimide plastic, or alternatively an epoxy resin, that is formed over the substrate 102 by a technique, such as printing, and is used to protect the parts on the substrate 102 that should not be soldered and to prevent solder from bridging between the conductive traces 104. The purpose of the solder mask 702 is to physically and electrically insulate those portions of the substrate 102 to which no soldering is desired.

Figure 8:
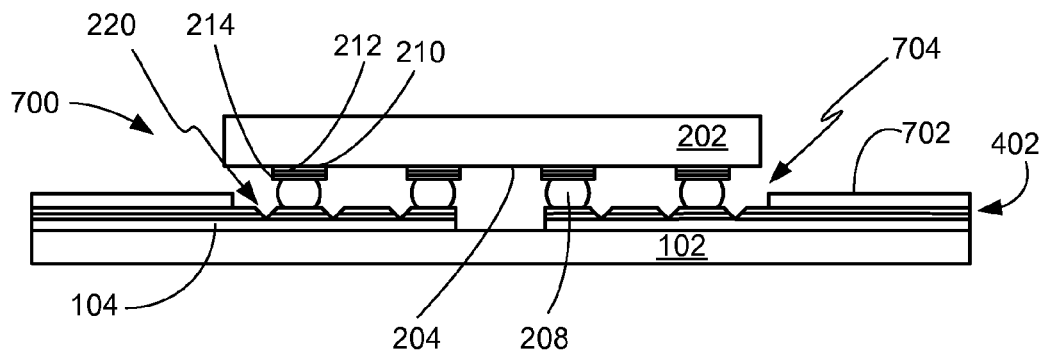
FIG. 8 is a cross-sectional view of the flip chip interconnection system along line 8-8 of FIG. 7.

Referring now to FIG. 8, therein is shown a cross-sectional view of the flip chip interconnection system 700 along line 8-8 of FIG. 7. The flip chip interconnection system 700 includes the flip chip 202, the substrate 102, the conductive bumps 208, the conductive traces 104, the grooves 220, and the solder mask 702.

For the flip chip interconnection system 700, the flip chip 202 is mounted on the substrate 102 in a face-down manner such that the active side 204 of the flip chip 202 faces the substrate 102. The flip chip 202 is electrically coupled to the substrate 102 using the conductive bumps 208, and signals from the flip chip 202 can be transmitted through the substrate 102.

The solder mask 702 has the area 704 exposed under the flip chip 202.

Figure 9:
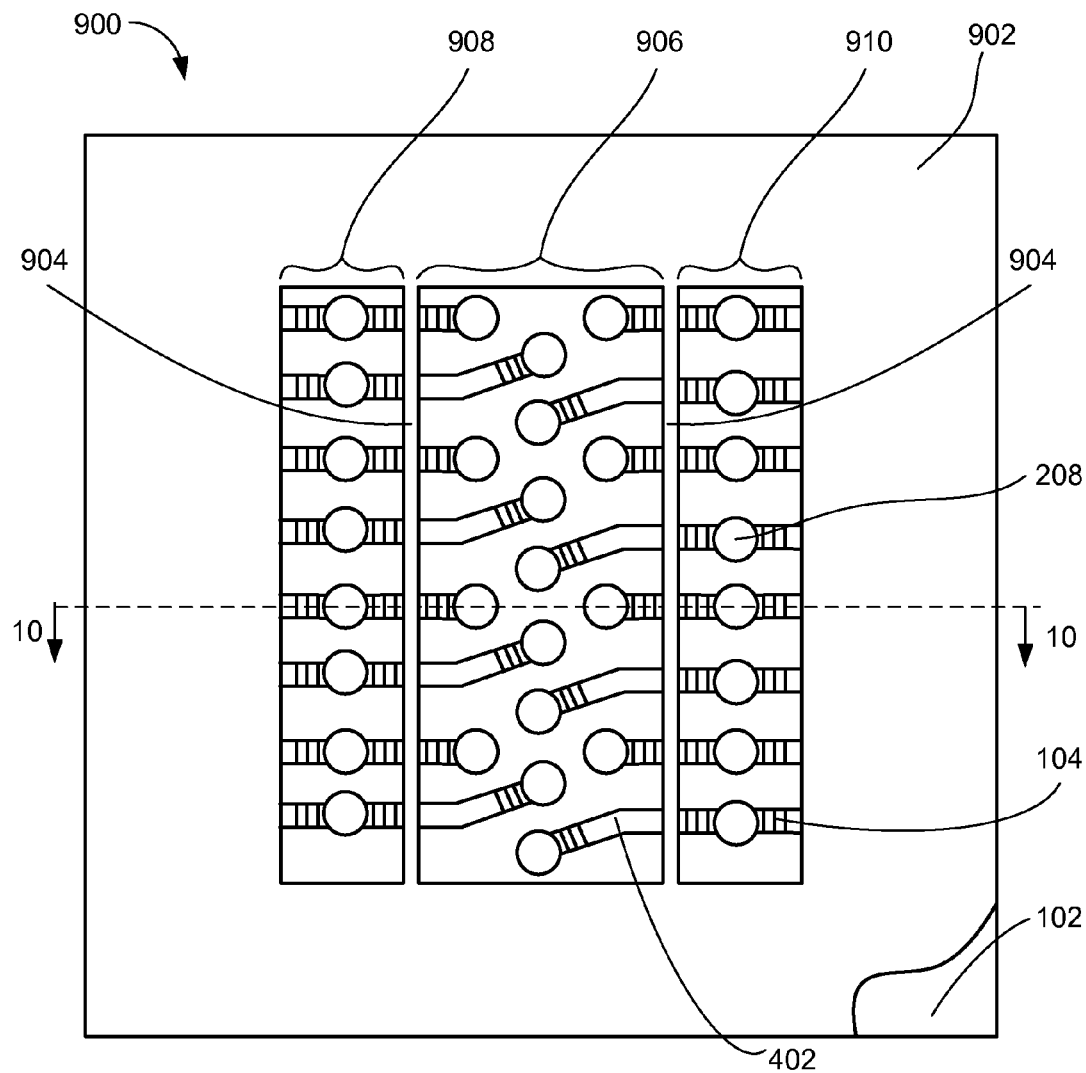
FIG. 9 is a top view of a flip chip interconnection system in a sixth embodiment of the present invention.

Referring now to FIG. 9, therein is shown a top view of a flip chip interconnection system 900 in a sixth embodiment of the present invention. The flip chip interconnection system 900 has the flip chip 202 removed.

The flip chip interconnection system 700 includes the substrate 102 with the conductive traces 104 coated with the protective coating 106. The conductive bumps 208 are on the protective coating 106 of the conductive traces 104.

Various embodiments of the present invention can be used with the solder mask 702 of FIG. 7 to minimize solder forming micro solder balls during reflow that may bridge the conductive traces 104 and cause short circuits.

However, another problem has been found that a full solder mask with openings for conductive bumps also reinforces the adhesion of the conductive traces to the substrate and, without the full solder mask, it is possible for the conductive traces to pull free of the substrate.

It has been discovered that it is possible to reinforce the adhesion strength between the substrate 102 and the conductive traces 104 by providing a solder mask 902 with solder mask strips 904 across the conductive traces 104 under the flip chip 202.

The solder mask strips 904 leave a center area 906, a first side area 908, and a second side area 910 exposed under the flip chip 202.

Figure 10:
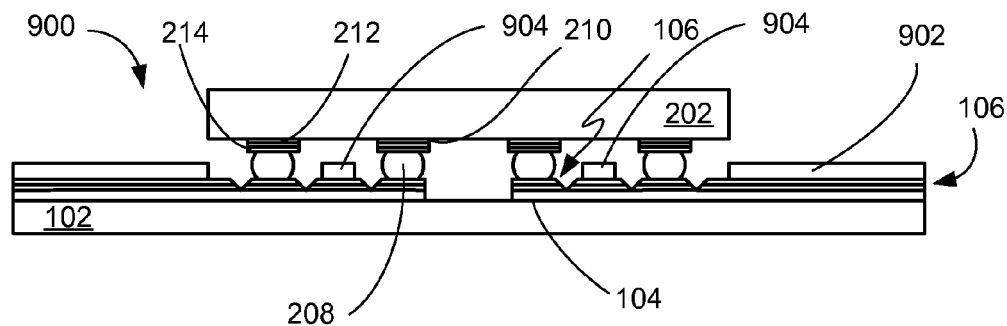
FIG. 10 is a cross-sectional view of the flip chip interconnection system along line 10-10 of FIG. 9.

Referring now to FIG. 10, therein is shown a cross-sectional view of the flip chip interconnection system 900 along line 10-10 of FIG. 9. The flip chip interconnection system 900 includes the flip chip 202, the substrate 102, the conductive bumps 208, the conductive traces 104, the grooves 220, and the solder mask 902.

For the flip chip interconnection system 900, the flip chip 202 is mounted on the substrate 102 in a face-down manner such that the active side 204 of the flip chip 202 faces the substrate 102. The flip chip 202 is electrically coupled to the substrate 102 using the conductive bumps 208, and signals from the flip chip 202 can be transmitted through the substrate 104.

The solder mask strips 904 are formed over the conductive traces 104 to reinforce the adhesion between the substrate 102 and the conductive traces 104.

Figure 11:
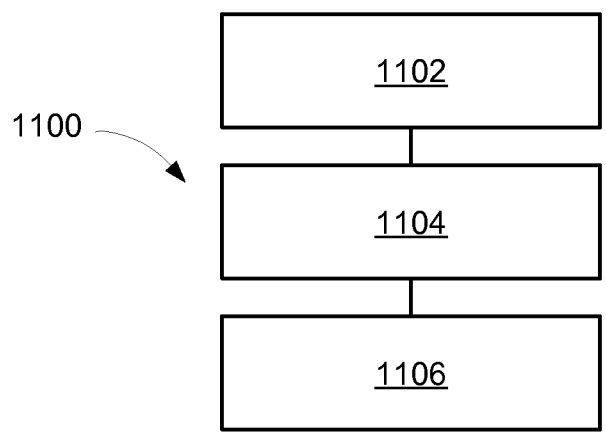
FIG. 11 is a flow chart of a flip chip interconnection system for manufacturing a flip chip interconnection system in an embodiment of the present invention.

Referring now to FIG. 11, therein is shown a flow chart of a flip chip interconnection system 1100 for manufacturing a flip chip interconnection system 1100 in an embodiment of the present invention.

The flip chip interconnection system 1100 includes: providing a conductive lead coated with a protective coating in a block 1102; forming a groove through the protective coating to the conductive lead for controlling solder position on a portion of the conductive lead in a block 1104; and attaching a flip chip having a solderable conductive interconnect to the portion of the conductive lead in a block 1106.

It has been discovered that the present invention thus has numerous aspects.

With fine pitches for copper leads, it is very hard to design the solder mask for putting solder bumps on leads or traces) because the solder mask must have holes/openings only where solder is to be placed on the leads.

A solder mask is also desired over most of the substrate because of a high risk of the solder forming micro solder balls during reflow and combining to bridge the leads where there is no solder mask.

In situations where copper is used for the conductive trace, problems have been encountered due to oxidation forming copper oxide. Solder does not bond well to copper oxide.

It has been discovered that, by putting a metal non-oxidizing finish (Ni/Au or an organic solderability preservatives) on the leads (Cu) and forming grooves through the non-oxidizing finish to the oxidizing material (Cu), it is possible to limit where the solder will go without needing a solder mask. The oxidizing material and the material of the substrate are solder-phobic so the solder will only stay on the metal non-oxidizing finish adjacent the groove.

It has also been discovered that V-grooves allow precise limiting of where the solder will go.

Because the metal non-oxidizing finish is expensive, it has been discovered that another less expensive non-oxidizing material (OSP) will also work.

Because of the possibility of the solder forming micro solder balls, it has been discovered that it is desirable to use a solder mask formed over most of the substrate and the leads with an area under the flip chip die exposed. A precise design of the solder mask is not required with this large flip chip opening.

It has also been found that it is desirable to reinforce the adhesion strength between the lead and substrate to avoid peeling. It has been discovered that an easy way to avoid peeling without having to go through precise design of the solder mask is to put strips of solder mask across the leads under the die.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A flip chip interconnection system comprising:
   a conductive lead coated with a protective coating having a groove, the protective coating having a first layer and a second layer, the groove through only the protective coating with the conductive lead exposed at a bottom of the groove for controlling a conductive bump position on a portion of the conductive lead,
   a flip chip having a flip chip interconnect attached to the portion of the conductive lead,
   a substrate having a conductive trace bonded thereto, where the conductive trace is a copper trace with a non-oxidizing finish;
   wherein
   the non-oxidizing finish has the groove through the non-oxidizing finish to the conductive trace for controlling solder position on a portion of the conductive trace; and
   the flip chip has the solderable conductive interconnect soldered to be held on the portion of the copper trace.

2. The system as claimed in claim 1 wherein the groove cut to the conductive trace is a V-groove to the conductive trace characteristic of being formed by a green laser.

3. The system as claimed in claim 1 wherein
   the substrate includes the copper trace, which is susceptible to oxidation to become solder-phobic;
   the substrate includes the non-oxidizing finish, which is a solder-philic non-oxidizing finish; and
   the groove through the non-oxidizing finish extends through the solder-philic non-oxidizing finish to the copper trace, which has become oxidized and solder-phobic.

4. The system as claimed in claim 1 wherein the flip chip is soldered to the substrate with solder bumps or conductive pillars tipped with solder.

5. The system as claimed in claim 1 further comprising a solder mask with solder mask strips over the substrate having an area under the flip chip exposed except for the solder mask strips for assuring adhesion of the copper trace to the substrate.

\* \* \* \* \*